United States Patent
Kim et al.

(10) Patent No.: US 7,184,265 B2
(45) Date of Patent: Feb. 27, 2007

(54) COOLING SYSTEM FOR A PORTABLE COMPUTER

(75) Inventors: Ye-Yong Kim, Suwon-si (KR); Harrison Ford Lee, Gunpo-si (KR); Jin-Kwan Choi, Seongnam-si (KR)

(73) Assignee: LG Electronics Inc., Seoul (KR)

( * ) Notice: Subject to any disclaimer, the term of this patent is extended or adjusted under 35 U.S.C. 154(b) by 32 days.

(21) Appl. No.: 10/786,307

(22) Filed: Feb. 26, 2004

(65) Prior Publication Data
US 2004/0240178 A1 Dec. 2, 2004

(30) Foreign Application Priority Data
May 29, 2003 (KR) ............ 10-2003-0034399
Jun. 13, 2003 (KR) ............ 10-2003-0038429

(51) Int. Cl.
H05K 7/20 (2006.01)
F28D 15/02 (2006.01)
H05K 5/02 (2006.01)

(52) U.S. Cl. .............. 361/687; 361/695; 361/696; 165/104.33

(58) Field of Classification Search ........ 361/695, 361/687, 696; 165/80.3, 104.33, 121
See application file for complete search history.

(56) References Cited

U.S. PATENT DOCUMENTS

| | | | |
|---|---|---|---|
| 6,166,908 A * | 12/2000 | Samaras et al. ........... 361/700 |
| 6,328,097 B1 * | 12/2001 | Bookhardt et al. .... 165/104.33 |
| 6,351,382 B1 * | 2/2002 | Nakanishi et al. ........ 361/700 |
| 6,377,219 B2 | 4/2002 | Smith ........................ 343/702 |
| 6,400,565 B1 * | 6/2002 | Shabbir et al. ............ 361/687 |
| 6,437,981 B1 | 8/2002 | Newton et al. ............ 361/700 |
| 6,997,241 B2 | 2/2006 | Chou et al. ............... 165/80.3 |

| | | | |
|---|---|---|---|
| 2002/0167799 A1 * | 11/2002 | Kawashima et al. ...... 361/700 |
| 2003/0016500 A1 * | 1/2003 | Malone et al. ............ 361/701 |

FOREIGN PATENT DOCUMENTS

| | | |
|---|---|---|
| CN | 1347281 | 5/2002 |
| CN | 1364251 | 8/2002 |
| CN | 2515800 | 10/2002 |
| JP | 11143585 A | 5/1999 |
| JP | 2002-278654 | 9/2002 |

OTHER PUBLICATIONS

David A. Reay, Heat Pipe, in AccessScience@McGraw-Hill, http://www.accessscience.com, DOI 10.1036/1097-8542.757297, May 13, 2002.*
Charles A. Harper, Cooling with Heat Pipes, Electronic packaging & Interconnection Handbook, pp. 2.79-2.80, Mc-Graw Hill, 1997.*
Chinese Office Action Dated Jul. 1, 2005.

* cited by examiner

Primary Examiner—Anatoly Vortman
(74) Attorney, Agent, or Firm—Fleshner & Kim, LLP

(57) ABSTRACT

A cooling system for a portable computer can include a frame having a heat-source connecting unit in its one side and having a fan housing unit in its other side. A dissipating unit on one side of the fan housing unit performs heat exchange and a dissipating fan forms an air stream that can pass through the dissipating unit. A plate-shaped cooling unit coupled to one side of the frame can deliver heat from the heat-source connecting unit to the dissipating unit. The cooling unit can include a micro cooling unit that performs heat exchange using a cooling cycle through phase change or a plate-heat pipe filled with liquid. According to embodiments of the present invention, a thickness of the cooling system can be reduced and cooling capability efficiency can be increased.

27 Claims, 8 Drawing Sheets

FIG. 1a
Conventional
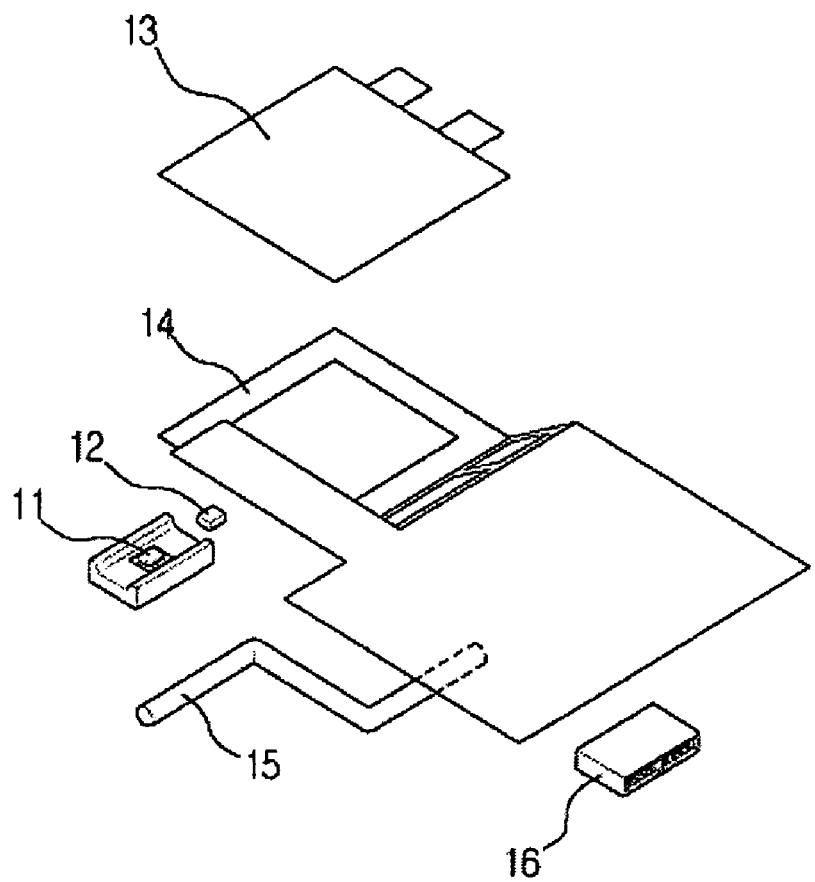
FIG. 1b
Conventional
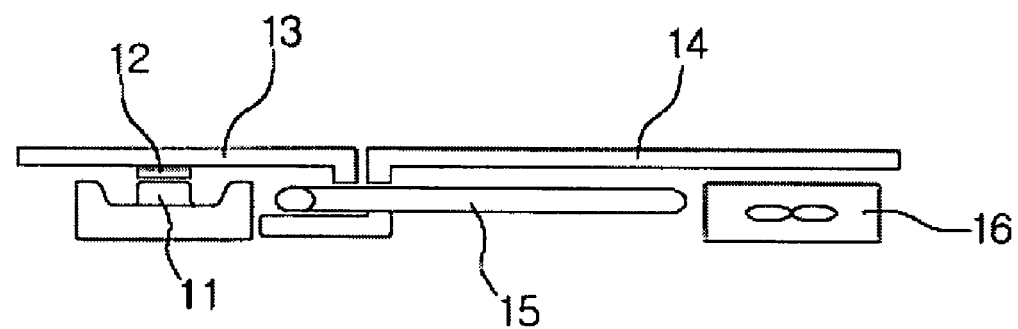

COOLING SYSTEM FOR A PORTABLE COMPUTER

BACKGROUND OF THE INVENTION

1. Field of the Invention

The present invention relates to a cooling system for a portable computer.

2. Background of the Related Art

In a recently marketed notebook computer, a CPU (Central Processing Unit) is provided as a module and detachable from a connector installed on a main board. Since the CPU is provided as a module, the CPU can be upgraded or replaced if a new CPU module is brought to the market. According to the conventional art, upgrade was possible only for the desktop PC (Personal Computer). The notebook computer could not be upgraded because the CPU in the notebook computer was not detachable from the main board. However, an upgrade for a notebook computer has become possible because the CPU is now provided as a module.

Since the CPU is provided as a module in the notebook computer there exists a need for an appropriate structure of a dissipating module for dissipating heat arising from the CPU during operations of the notebook computer system. At the moment, since the heat arising from the CPU not only causes malfunction of the system but also shortens life of the product, a structure for swiftly emitting heat is highly required.

FIGS. 1a and 1b are diagrams showing a structure for emitting heat in a notebook computer according to the conventional art. As shown in FIGS. 1a and 1b, a thermal pad 12 is arranged to be touched on the upper part of a CPU 11, and a first and a second dissipating plates 13 and 14 are provided. The first and the second dissipating plates 13 and 14 are connected each other by a heat pipe 15. The reason the dissipating plate is divided into the first and the second dissipating plates 13 and 14 is to make it possible to directly replace the CPU 11 by only disassembling the first dissipating plate 13, without disassembling many additional parts to perform an upgrading process for the CPU 11.

In addition, a fan 16 for swiftly emitting inner heat to the outside is installed in the notebook computer. As a result, examination of a heat dissipating path in the dissipating structure of the conventional art shows that heat arising from the CPU 11 during operations sequentially passes through the thermal pad 12, the first dissipating plate 13, the heat pipe 15, and the second dissipating plate 14, and is finally diverged into the inner space of the notebook computer. Then, the fan 16 operates to exchange the heated air at the inside with the cool air at the outside to cool down the inner space of the notebook computer and lower its temperature.

As described above, the conventional dissipating structure in a notebook computer has various disadvantages. In the conventional dissipating structure of the notebook computer, the thermal pad 12 attached to the upper surface of the CPU 11 should stick to the first dissipating plate 13, but sticking process is cumbersome because a screw is used upon installation. Further, since the dissipating plate is divided into two elements 13 and 14 that are connected by the heat pipe, heat transfer area is reduced and dissipating efficiency is deteriorated. In addition, a thickness of the heat dissipating system is increased.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to reduce a thickness of a portable computer cooling system to reduce or minimize a thickness of a portable computer using the cooling system.

Another object of the present invention is to provide a cooling system for use in a portable computer capable of increasing cooling efficiency or quantity.

Another object of the present invention is to provide a portable computer cooling system capable of allowing access to a modular CPU.

Another object of the present invention is to provide a portable computer cooling system capable of allowing limited access or access only to a modular CPU.

In order to achieve at least the above objects and advantages in a whole or in part, in accordance with one aspect of the present invention there is provided a cooling system for a portable computer that includes a frame having a heat-source connecting unit in a first side and having a fan housing unit in a second side, a dissipating unit on one side of the fan housing unit of the frame that is configured to perform heat exchange, a dissipating fan within the fan housing unit configured to form an air stream that would pass through the dissipating unit from inside the fan housing unit, and a cooling unit coupled to the first side of the frame and configured to deliver heat from the heat-source connecting unit to the dissipating unit.

To further achieve at least the above objects in a whole or in part, in accordance with one aspect of the present invention there is provided a cooling system for use in a portable computer that includes a dissipating plate having a dissipating fan in its one side and having a settle-down groove in its inside, a settle unit coupled to a lower surface inside of the settle-down groove in the dissipating plate, a micro cooling system having a first side coupled to an upper surface of the settle unit and a second opposite side configured to face a processor, wherein the micro cooling system is configured to perform heat exchange by repeating a cooling cycle of condensation and evaporation using a capillary phenomenon to transfer heat arising from the processor.

To further achieve at least the above objects in a whole or in part, in accordance with one aspect of the present invention there is provided a cooling system for a portable computer that includes a frame having a heat-source connecting unit in a first side and having a fan housing unit in a second side, a dissipating unit on one side of the fan housing unit of the frame that is configured to perform heat exchange, a dissipating fan with the fan housing unit configured to form an air stream that would pass through the dissipating unit from inside the fan housing unit, and a plate-heat pipe on one side of the frame and configured to deliver heat from the heat-source connecting unit to the dissipating pin by circulating a fluid through its inside.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 1a and 1b are diagrams showing a schematic perspective view and a cross-sectional view, respectively, of a conventional art cooling system for use in a notebook computer;

DETAILED DESCRIPTION OF PREFERRED EMBODIMENTS

Figure 2:
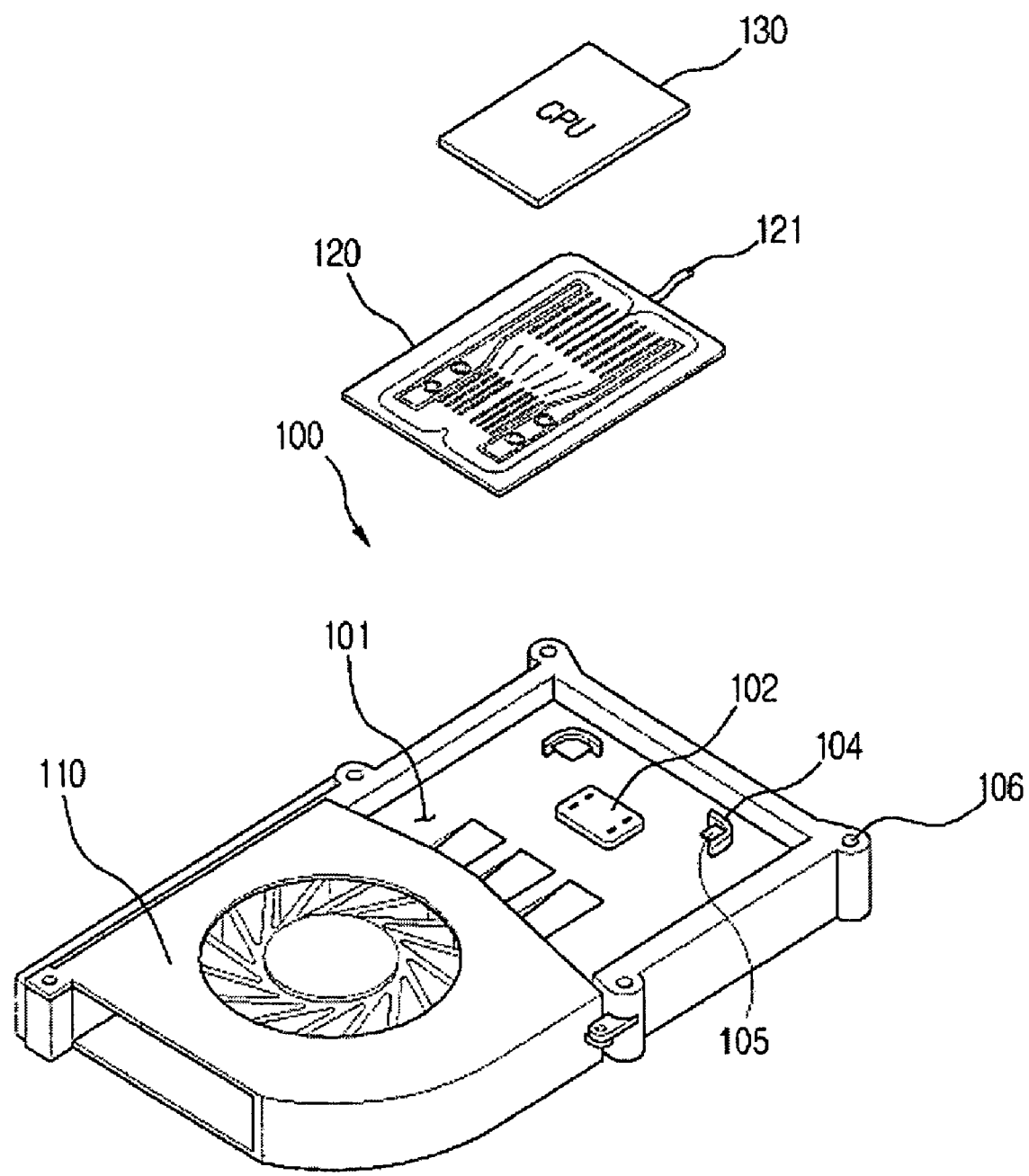
FIG. 2 is a diagram showing an exploded, perspective view of a cooling system according to a preferred embodiment of the present invention.
Figure 3:
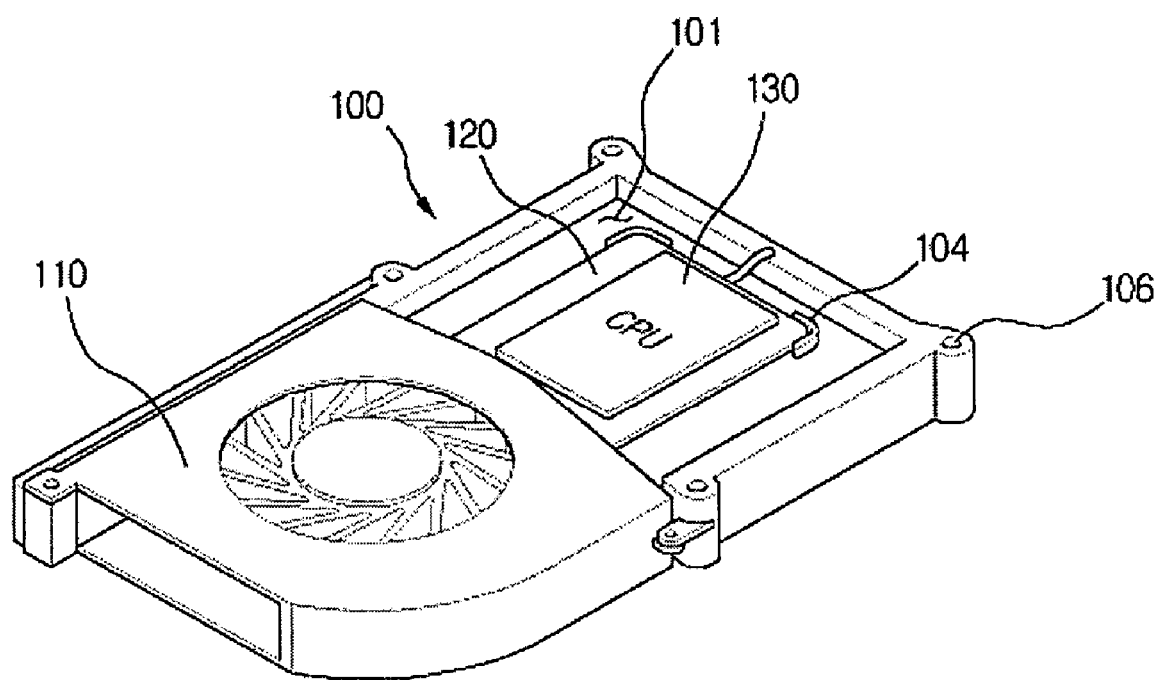
FIG. 3 is a diagram showing a perspective view of a cooling system according to a preferred embodiment of the present invention.

FIG. 2 is an exploded perspective view of a cooling system for use in a portable computer according to an embodiment of the present invention. FIG. 3 is a view showing an assembled state of the cooling system of FIG. 2.

Figure 4:
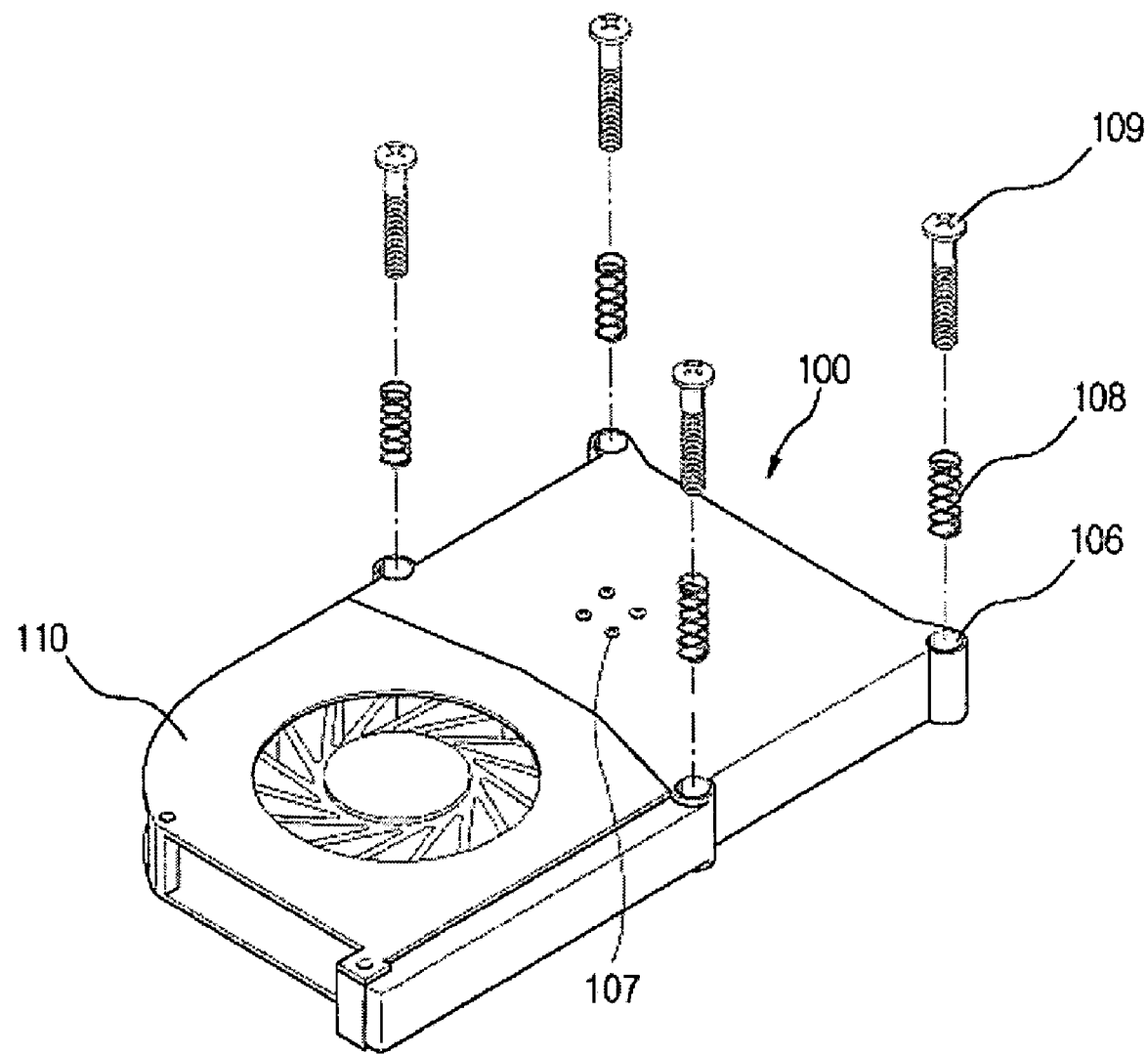
FIG. 4 is a diagram showing a perspective view of joining status of a cooling system according to a preferred embodiment of the present invention.

As shown in FIGS. 2–4, an embodiment of a cooling system according to the present invention can include a dissipating plate or cooling unit 100 having a settle unit 102 and a guide protuberance 104 on its inner groove 101, a dissipating fan 110 joined to one side of the dissipating plate, a micro cooling system (MCS) 120, and a coil spring 108 and a screw 109 for giving elastic force when the dissipating plate 100 is mounted on the CPU of the main board. The MCS 120 can include a lower surface coupled to the upper surface of the settle unit 102 of the dissipating plate 100, and an upper surface faced with the CPU 130. The MCS 120 is a system that preferably has a cooling cycle for performing heat exchange by repeating condensation and evaporation of its own using capillary phenomenon.

As shown in FIG. 2, to cool down the CPU 130, the cooling system can include a heat dissipation path with the dissipating plate 100, the dissipating fan 110, and a micro cooling system 120. The settle-down groove 101 to which the micro cooling system 120 and the CPU 130 can be joined, is provided to the inside of the dissipating plate 100 and a dissipating fan 110 is joined to its one side. Accordingly, heat arising from the CPU 130 in the inside of the dissipating plate can be emitted to the outside and preferably outside the portable computer.

The dissipating plate 100 can be made of aluminum, and the settle unit 102 can be projected to join to the CPU on the center of the settle-down groove 101. The settle unit 102 can be made of copper (Cu) or the like, and a screw 107 can be tapping-processed by being fastened to the inside from the outside.

On the upper surface of the settle unit 102, the micro cooling system 120 is preferably plane-contacted and settled down. The micro cooling system 120 can be made of copper or the like, and the micro cooling system 120 can be fixed such as by having a lower surface preferably braze-joined to the upper surface of the settle unit 102.

An assembly, which can be formed by integrally joining the micro cooling system 120 to the settle unit 102, can be fixed to the dissipating plate 100 by forming holes on the back of the dissipating plate 100 and fastening at the settle unit 102 with the screw 107. By forming in advance a plurality of screw holes on the settle unit 102 through tapping process, screw fastening becomes possible. As the selected position or optimum condition for fixing the CPU 130 on the main board, the height of the settle unit 102 may be possibly adjusted depending on the spaces between the main board and the bottom of the dissipating plate 100 and the CPU. Thus, the dissipating plate 100 can surround the heat source.

The micro cooling system 120 can include a coolant injecting hole 121 and its inner circulation loop can be made substantially a vacuum. Then, a coolant can be injected and the coolant injecting hole 121 is sealed, which can complete manufacturing of the micro cooling system 120.

When the settle unit 102 and the micro cooling system 120 are fixed in the inside of the dissipating plate 100, the micro cooling system 120 can be settled down on a settle-down surface 105 of the guide protuberance 104, which can be projected right and left of the settle unit 102. Thus, movement of the micro cooling system 120 can be prevented. The guide protuberance 104 is of an exemplary "¬" shape and a plurality of guide protuberances can be installed so that the micro cooling system 120 can maintain its horizontal balance and prevent itself from moving to back and forth, right and left. However, the present invention is not intended to be so limited as other shapes of the guide protuberance can be used. Further, the height of the settle-down surface 105 can be formed in relation to almost (e.g., an equal height) the settle unit 102.

If assembling of the cooling system is completed, the CPU 130 can be assembled to the cooling system as shown in FIG. 3. Then, the dissipating plate 100 can be reversed to be joined, as shown in FIG. 4, to the main board so that the upper surface of the CPU 130 may stick or be adjacent to the upper surface of the micro cooling system 120.

Then, as shown in FIG. 4, after the micro cooling system 120 has assembled to or thermally coupled to the CPU, the dissipating plate 100 can be fixed on the main board (not shown) by fastening the screw 109 together with the coil spring 108 through a screw hole 106 formed at each corner on the back of the dissipating plate 100. However, the present invention is not intended to be so limited as other coupling arrangements can affix a cooling system to a main board. The coil spring 108 can reduce or prevent an external impulse from being delivered to the CPU 130 and the micro cooling system positioned between the dissipating plate 100 and the main board.

Figure 5:
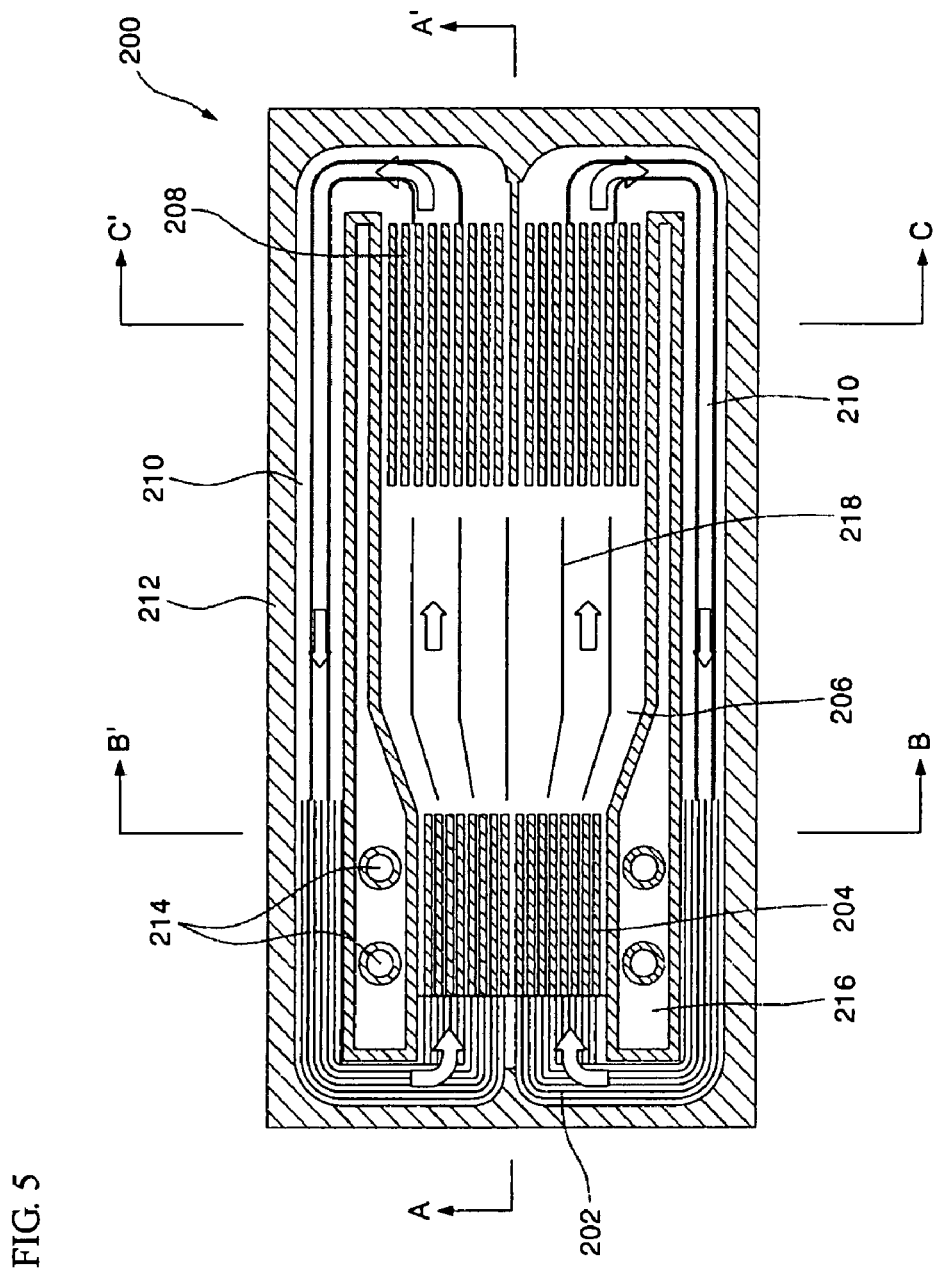
FIG. 5 is a diagram showing a plan view of an exemplary micro cooling system according to a preferred embodiment of the present invention.
Figure 6:
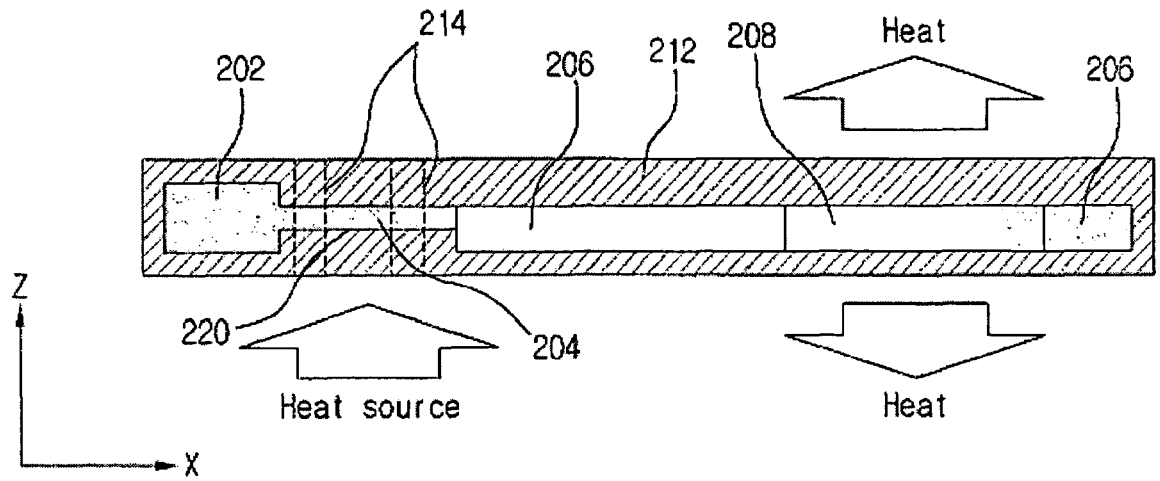
FIG. 6 is a diagram showing a cross-sectional view taken along line A–A' of FIG. 5.
Figure 7:
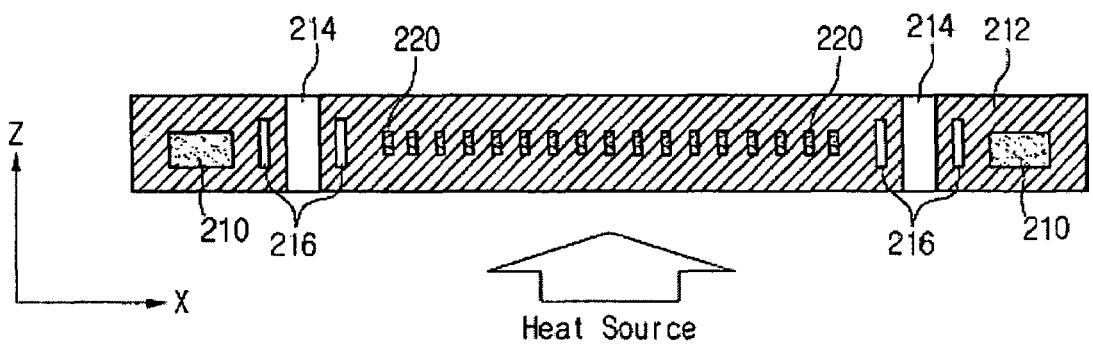
FIG. 7 is a diagram showing a cross-sectional view taken along line B–B' of FIG. 5.
Figure 8:
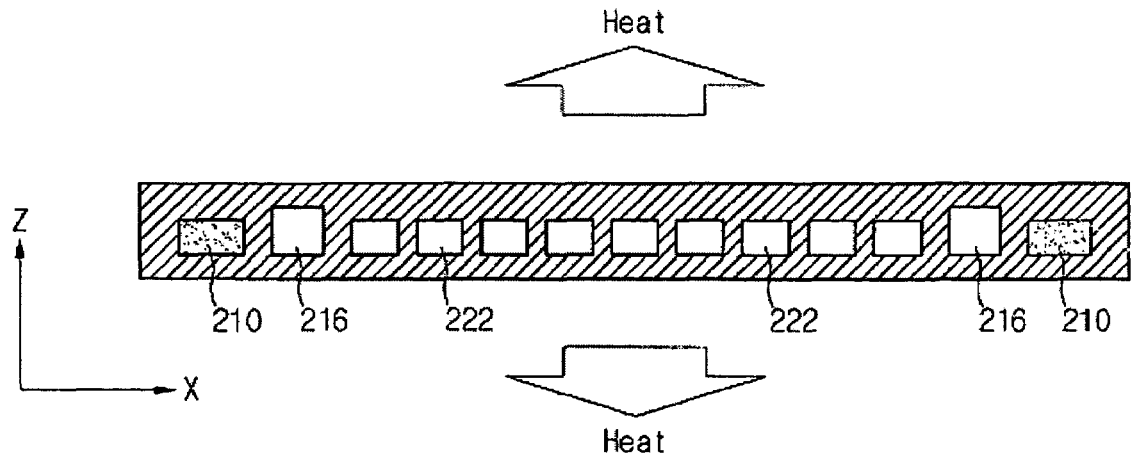
FIG. 8 is a diagram showing a cross-sectional view taken along line C–C' of FIG. 5.

In the meantime, FIG. 5 is a plan view showing an exemplary micro cooling system 200 according to the embodiment of the present invention. FIG. 6 is a cross-sectional view schematically showing a cross-section on XZ plane, taken along line A–A' of FIG. 5, FIG. 7 is a cross-sectional view taken along line B–B' of FIG. 5, and FIG. 8 is a cross-sectional view taken along line C–C' of FIG. 5.

As shown in FIGS. 5 to 8, the micro cooling system 200 can be configured in such a way that a circulation loop of a coolant is formed in the inside of the rectangular housing 212. The coolant can circulate in a direction shown by the arrows and cools down by delivering heat of an external heat source contacting the micro cooling system 200, using latent heat generated upon phase change between liquid phase and gas phase.

A housing can be manufactured using a variety of materials including semiconductor materials such as silicon, Ga, new materials such as self assembled monolayer (SAM), metal such as copper (Cu) or aluminum (Al) whose thermal conductivity is excellent, or alloy of such metals, high molecular materials such as ceramics, plastics, and crystalline materials such as a diamond. In case that the external heat source is a semiconductor chip, i.e., a CPU, it is possible to reduce or minimize contact-heat resistance by forming a housing 212 using the same material as the surface material of the external heat source. Further, it is possible to form the housing 212 in two layers with different characteristics. Further, the housing 212 can be formed integrally with the surface material of the external heat source in the manufacturing process of the semiconductor chip.

A coolant for use in the micro cooling system 200 according to embodiments of the present invention can be selected from a variety of coolants capable of generating phase change between liquid phase and gas phase owing to heat arising from external heat sources such as the CPU. For example, water or a coolant from an alcohol series has a large thermal capacity, and has a small contact angle due to surface tension with respect to the inner wall of a semiconductor material thereby causing a flowing velocity of a coolant to increase or become large, which is advantageous in increasing or delivering a quantity of heat. Further, unlike a coolant from Freon series, since the coolant of embodiments of the present invention preferably have no problem of environmental pollution, there is no possibility that environmental pollution is generated even though the coolant leaks out due to a fine crack of the housing 212 on the circulation loop.

A circulation loop of the coolant is configured in such a way that the coolant can start from a coolant storing block 202 formed at one end in the inside of the housing 212, sequentially moves through evaporation block 204 coupled to one end of the coolant storing block 202, a gaseous coolant moving block 206, a condensation block 208 and a liquid coolant moving block 210. From the liquid coolant moving block 210, the coolant can return back to the coolant storing block 202 again. Heat absorption by evaporation block 204 and heat dissipation by the condensation block 208 can be on the same or opposite sides of the micro cooling system 200. Further, heat absorption or dissipation can be performed on both opposite sides of the micro cooling system.

The coolant storing block 202 has an appropriate volume for storing a predetermined amount of a coolant in liquid phase. At the exit side to which the coolant in the coolant storing block 202 gets out, the evaporation block 204 can be coupled, and the evaporation block 204 can have a plurality of first fine channels 220 arranged in one layer on the same plane as shown in FIG. 7. The evaporation block 204 can evaporate the coolant of a liquid phase filled in the first fine channels 220 into the coolant of a gas phase using heat absorbed from the external heat source.

Further, as shown in FIGS. 6 and 7, the depth of the first fine channels 220 is preferably shallower than the depth of the coolant storing block 202. In the inside of the first fine channels 220, the coolant of a liquid phase stored in the coolant storing block 202 can be partially filled up to a predetermined portion of the first fine channels 220 from the coolant storing block 202 by the surface tension with respect to the inner wall of the first fine channels 220 and the capillary phenomenon. The depth or cross-sectional area of the first fine channels 220 can be determined in such a way that the surface tension in the inside of the first fine channels 220 is larger than the gravitational force.

The cross section of the first fine channels 220 can be formed in a variety of shapes such as circular, rectangular, square, polygonal shapes as well as a rectangular shape. Further, it is possible to control intensity of the surface tension of the coolant with respect to the inner wall of the first fine channels 220 by increasing or reducing the cross-sectional area along lengthwise direction of the first fine channels 220. In addition, it is possible to determine moving direction of the coolant or control moving velocity of the coolant by forming a plurality of grooves in the inner wall of the first fine channels 220 or installing a plurality of nodes so that the cross-sectional area can change along the lengthwise direction of the first fine channels 220.

The condensation block 208 can be formed at the position spaced lengthwise as much as a predetermined distance, on the same plane, from the first fine channels 220 of the evaporation block 204. As shown in FIG. 8, the condensation block 208 can include a plurality of second fine channels 222 arranged in one layer on the same plane, capable of condensing the coolant of gas phase that has been evaporated and moved from the first fine channels 220.

As shown in FIG. 8, the depth of the second fine channels 222 can be deeper than the depth of the first fine channels 220, but is not necessarily limited to this. In the inside of the second fine channels 222, the coolant of a liquid phase condensed in the condensation block 208 can be partially filled up to a predetermined portion of the second fine channels 222 by the surface tension with respect to the inner wall of the second fine channels 222 and the capillary phenomenon. The depth or cross-sectional area of the second fine channels 222 can be conventionally determined in such a way that its surface tension is larger than the gravitational force.

To improve a heat emission effect, a plurality of pins can be formed in the outside of the housing 212 adjacent to the condensation block 208. In case that a plurality of the pins is formed, it may be also possible to operate to circulate the surrounding air by recycling the heat emitted to the outside from the condensation block 208. Further, in case that a plurality of the pins is formed using a fine structure that includes thermoelectric element(s), it is possible to obtain energy for use in fine operation by converting the heat emitted from the condensation block 208 into electric energy.

Between the first fine channels 220 of the evaporation block 204 and the second fine channels 222 of the condensation block 208, the gaseous coolant moving block 206 can be positioned for functioning as a path through which the coolant of gas phase can move. The gaseous coolant moving block 206 can have a plurality of first guides 218 for uniformly moving the coolant of gas phase that has been evaporated in a direction toward of the condensation block 208. As shown in FIG. 5, the gaseous coolant moving block 206 can be formed in such a way that the cross section at the entry side of the second fine channels 222 is wider than the cross section at the exit side of the first fine channels 220 from which the coolant of gas phase flows out. It is possible to make the coolant of gas phase condense in the condensation block 208 using merely the neighboring convention phenomenon, by forming the condensation block 208 in a larger volume than the evaporation block 204.

As shown in FIG. 5, between the second fine channels 222 of the condensation block 208 and the coolant storing block 202, a liquid coolant moving block 210 can be formed through which moves the liquid phase coolant condensed in the inside of the second fine channels 222. The liquid coolant moving block 210 can be separated from the gaseous coolant moving block 206 and the flowing directions of the coolant are different each other.

The gaseous coolant moving block 206 and the liquid coolant moving block 210 can be separated thermally and physically by an insulating block 216. The insulating block 216 can be formed in such a way that it is sealed in the inside of the housing 212 or it is opened at both the top and bottom of the housing 212. In case of being sealed in the inside of the housing 212, the insulating block 216 may maintain a vacuum state or preferably be filled with air or other insulating materials.

As shown in FIG. 5, the liquid coolant moving block 210 can be positioned symmetrically in both directions along the outer periphery on both sides of the housing 212. The coolant circulation loop symmetrically formed along the outer periphery of such housing 212 can be very advantageous formed of a thin plate shape, particularly if its aspect ratio of the cross section is large. In that case, heat flow conducted and diffused also to the radial direction can be effectively convection-diffused over a larger area. Since it can be advantageous in subcooling the coolant in the channel and lowering the temperature at the entry of the evaporation block 204 by arranging two liquid coolant moving blocks 210 along the peripheries of the cooling system 200, much thermal energy per unit mass flux can be delivered. Further, such dual direction circulation loop can be advantageous in that flowing of the coolant can be swiftly performed through the liquid coolant moving block 210 in one side even in case that the cooling system 200 is so inclined that the gravitational positions of the dual direction liquid coolant moving blocks 210 are varied much with respect to each other and coolant circulation to the liquid coolant moving block 210 in the other side is not properly performed.

The liquid coolant moving block 210 can include at least a single third fine channels formed in such a way that the surface tension of the coolant of liquid phase with respect to the inner wall of the liquid coolant moving block 210 is larger than the gravitational force lest the liquid coolant moving block 210 should be influenced by the gravitational force. Thus, it is preferable to form a plurality of grooves (not shown) in a movement direction of the coolant of liquid phase, within or on the liquid coolant moving block 210 or to separate the liquid coolant moving block 210 into more than two third fine channels in order to reduce influence of the gravitational force.

It is also possible to additionally form a plurality of second guides (not shown) for guiding movement of the coolant of liquid phase at the boundary portions between the coolant storing block 202 and the liquid coolant moving block 210, and between the condensation block 208 and the liquid coolant moving block 210 so that flow can increase and damage generated due to rapid circling of the coolant flow can be reduced.

As described above, the coolant storing block 202 should have such proper volume as to supply sufficient coolant even under heat load from a variable heat source. To prevent rapid dry-out phenomenon at the evaporation block 204, the coolant storing block 202 is preferably installed closely to the entry side of the evaporation block 204 so that the coolant can be swiftly supplied. However, when the coolant storing block 202 is installed too closely to the evaporation block 204, unnecessary bubble can be generated due to heat delivered through the bottom of the housing 212 contacting the external heat source. The growth of the bubble can block off the entry of the first fine channels 220 of the evaporation block 204. Thus, there is possibility that supply of the coolant can be stopped and cause dry-out of the coolant in the inside of the evaporation block 204. To reduce or suppress heat transfer to the coolant storing block 202, it is preferable to form the thickness of the bottom of the housing thin in a direction perpendicular to a direction of heat flow, for example, in the range from the boundary between the coolant storing block 202 and the evaporation block 204, to the bottom of the housing 212 contacting the external heat source. For example, a groove can be formed on the bottom of the housing 212.

Figure 9:
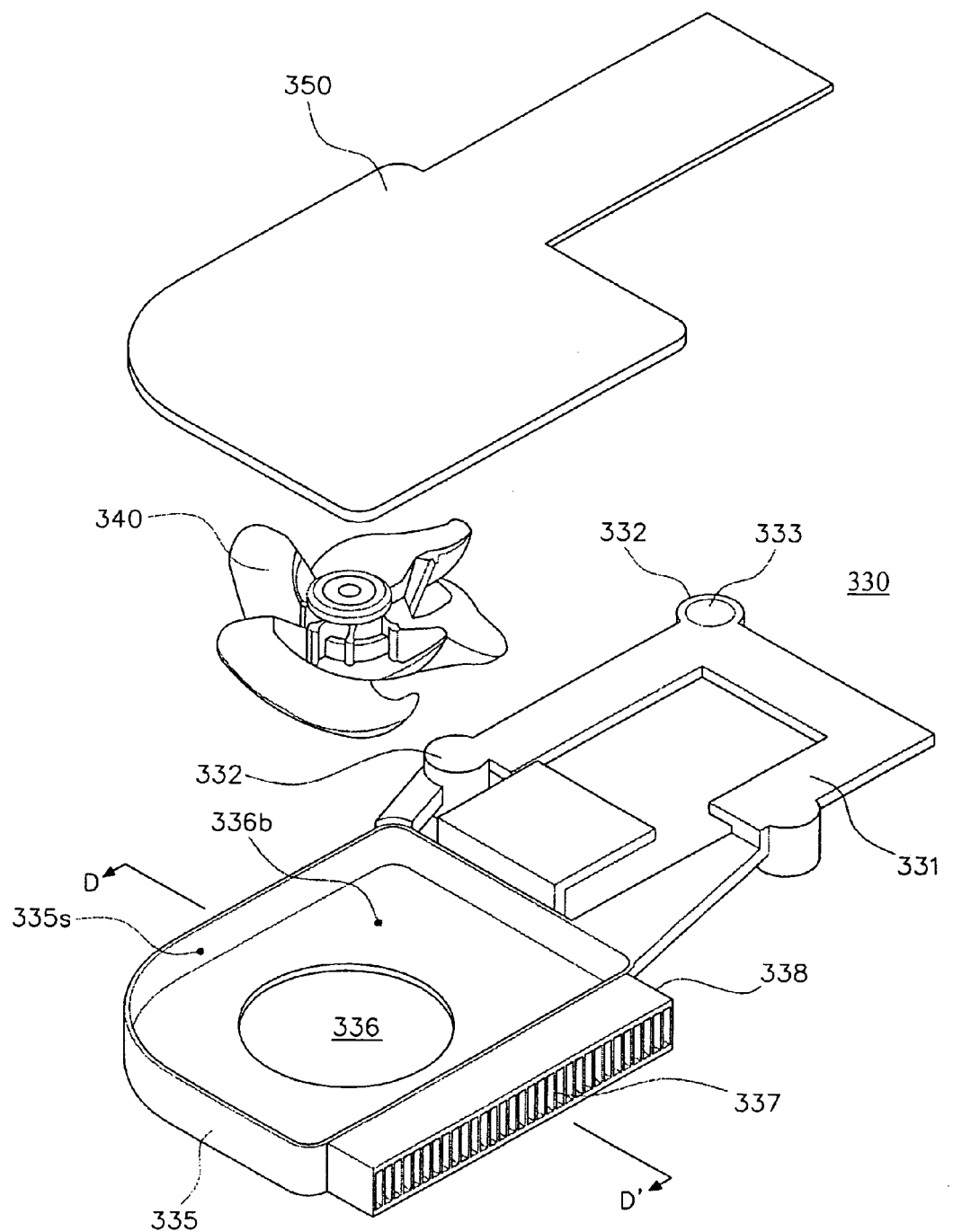
FIG. 9 is a diagram showing a perspective view of a cooling system according to another embodiment of the present invention.
Figure 10:
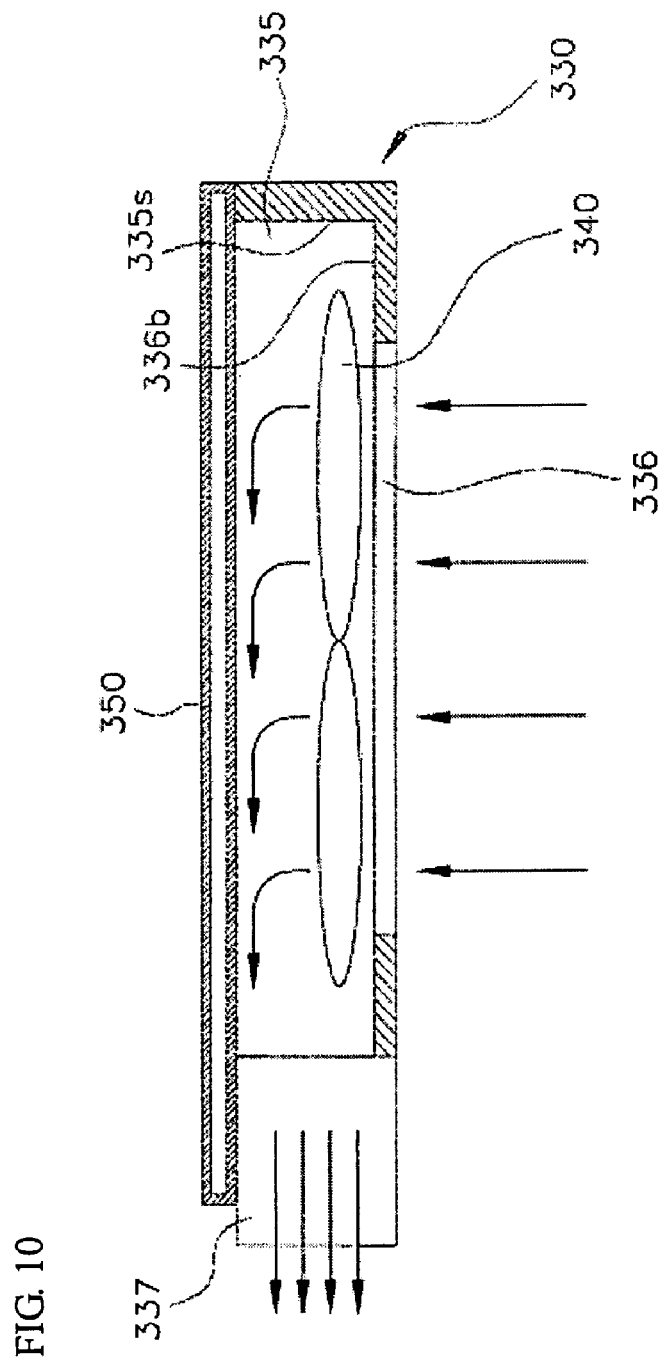
FIG. 10 is a diagram showing a cross-sectional view taken along line D–D' of FIG. 9.

FIG. 9 is a diagram showing a perspective view of another preferred embodiment of a cooling system for use in a portable computer according to the present invention. FIG. 10 is a cross-sectional view taken along line D–D' of FIG. 9.

As shown in FIGS. 9 and 10, a cooling system can include a frame 330 of a predetermined shape that forms a framework. The frame 330 can include a heat-source connecting unit 331 in its one side, and the heat-source connecting unit 331 can have a plurality of joining bosses 332. At the joining boss 332, a joining cavity 333 is preferably formed in a passing through manner. The joining boss 332 is preferably a part to which a fastening screw is fastened for joining to the main board equipped with, for example, a heat source (e.g., a chip). The heat-source connecting unit 331 can be installed to directly touch the chip, which is a heat source, depending on design and performance conditions.

To one side of the heat-source connecting unit 331, a fan housing unit 335 can be provided. A dissipating fan assembly 340 can be coupled to the fan housing unit 335. In the inside of the fan housing unit 335, a predetermined space is formed. The space formed by the fan housing unit 335 can be partitioned by a bottom plate 336b, a sidewall 335s, and a plate-heat pipe 350. On the bottom plate 336b, an absorption port 336 can be formed through which air can enter the inner space of the fan housing unit 335.

The fan housing unit 335 preferably has a dissipating unit 338 and/or a dissipating pin 337 in its one side. The dissipating pin 337 can be installed at the open portion on one side of the sidewall 335s of the fan housing unit 335. The air stream formed by the dissipating fan assembly 340 is discharged from the inner space of the fan housing unit 335 through the dissipating pin 337, whereby heat exchange is performed. The dissipating pin 337 can be a part for emitting the heat that has been delivered through the plate-heat pipe 350. Generally, the dissipating pin 337 can be made of metal whose thermal conductivity is excellent, and designed so that heat-contact area with respect to air is increased or maximized. Preferably, the entry side of the dissipating pin 337 is installed closely to a dissipating port formed on a main machine of the portable computer.

In the inside of the fan housing unit 335, the dissipating fan assembly 340 can be installed. The dissipating fan assembly 340 provides motive force by which air is absorbed through the absorption port 336 and emitted through the open portion including the dissipating pin 337. Preferably, an axial-flow blower is used for the fan in the dissipating fan assembly 340.

On the frame 330, the plate-heat pipe 350 can be installed. The plate-heat pipe 350 can shield the upper side of the fan housing unit 335 completely and also covers part of the heat-source connecting unit 331. A part of the plate-heat pipe 350 preferably sticks to one side of the heat-source connecting unit 331.

The plate-heat pipe 350 can be configured in such a way that a fluid circulates in its inside, and the fluid circulating in the inside of the plate-heat pipe 350 plays a role of transferring heat from one side to the other side of the heat-plate pipe 350. The plate-heat pipe 350 is preferably relatively thin in its thickness compared to the heat pipe of the conventional art. The heat pipe can be about 2 mm in its thickness, however, the recently developed plate-heat pipe 350 is preferably about 1 mm in its thickness and can be liquid filled.

Operations of the cooling system for use in the portable computer as shown in FIGS. 9–10 will now be described. As shown in FIG. 10, the cooling system emits heat arising from the heat source contacting the side of the heat-source connecting unit 331, to the outside through the dissipating pin 337. The heat arising from the heat source can be delivered from the heat-source connecting unit 331 to the fan housing unit 335 through the frame 330 or the plate-heat pipe 350.

The heat can be delivered from the frame 330 or the plate-heat pipe 350, to the dissipating pin 337 since heat is generally transferred from high temperature to low temperature. In the preferred embodiment of FIGS. 9–10, relatively more heat quantity is delivered through the plate-heat pipe 350 compared to the quantity of heat delivered through the frame 330 or the dissipating plate in the conventional art. Actual experiment shows that the plate-heat pipe 350 delivers about ten times more heat than the dissipating plate of the same shape made of copper of the conventional art.

In the meantime, air absorbed through the absorption port 336 from the outside of the dissipating module into the dissipating fan assembly 340 provided to the inside of the fan housing unit 335 by operation of the dissipating fan assembly 340, can be discharged from the dissipating fan assembly 340. Further, such absorbed air flow can be given heat by colliding against the back of the plate-heat pipe 350.

Then, an air stream can be formed to the dissipating pin 337 because the space formed in the inside of the fan housing unit 335 communicates with the outside only through the dissipating pin 337 if the absorption port 336 is excluded. Preferably, the air stream discharged from the dissipating fan assembly 340 can collide against the plate-heat pipe 350, and be is discharged to the side of the dissipating pin 337. The air discharged from the dissipating fan assembly 340 is not discharged to the outside through the absorption port 336 because the absorption port 336 is a path through which the air stream formed by the dissipating fan assembly 340 enters or is absorbed.

The air that has been give heat from the plate-heat pipe 350 and the dissipating pin 337 in the fan housing unit 335 can be discharged to the outside of the portable computer through the dissipating port of the main machine. The frame 330 can form a space enclosing a heat source (e.g., chip) on the main board.

Any reference in this specification to "one embodiment," "an embodiment," "another embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

As described above, embodiments of a cooling system for use in a portable computer according to the present invention have various advantages. For example, embodiments of a cooling system for use in the portable computer according to the present invention can provide a simple and light weight portable computer by making its thickness very thin, and increase a cooling capacity and a cooling efficiency. In addition, access to a CPU is directly available through the cooling system. Further, a very thin cooling system allows a portable computer to have a reduced thickness.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A cooling system for a portable computer comprising:
   a frame having a heat-source connecting unit contained within a first side and having a fan housing unit in a second side;
   a dissipating unit on one side of the fan housing unit of the frame that is configured to perform heat exchange;
   a dissipating fan within the fan housing unit configured to form an air stream that would pass through the dissipating unit from inside the fan housing unit; and
   a cooling unit coupled to the first side of the frame and configured to deliver heat from the heat-source connecting unit to the dissipating unit, wherein the cooling unit is a micro cooling unit configured to perform heat exchange using a cooling cycle caused by phase change, and wherein the micro cooling unit has an internal circulation loop that comprises,
      a liquid coolant moving block configured to return coolant to a beginning of a liquid phase transition block from an end of the liquid phase transition block, and
      an insulation block between the liquid phase transition block and liquid coolant moving block.

2. The cooling system as claimed in claim 1, wherein the frame and the cooling unit provide two heat removing paths to the dissipating unit.

3. The system of claim 1, wherein the liquid phase transition block comprises:
   a liquid coolant storage block at one end;
   a evaporation block having first channels coupled to the liquid coolant storage block;
   a gaseous coolant moving block coupled to the evaporation block; and
   a condensation block having second channels coupled to the gaseous coolant moving block.

4. The system of claim 3, wherein the first channels have a size smaller than the second channels.

5. The cooling system of claim 3, wherein the liquid coolant storage block, the evaporation block and the gaseous coolant moving block of said micro cooling unit each has first and second layers having different characteristics, and wherein at least a portion of the micro cooling unit and a processor are integrally formed of the same material.

6. The system of claim 1, wherein the insulation block includes gas or an insulating material.

7. The system of claim 1, wherein the insulation block varies in size as it extends along the liquid coolant moving block.

8. The system of claim 1, wherein said liquid phase transition block comprises a first fluid passage directly connecting evaporation and condensation blocks of the liquid phase transition block, wherein a cross-section of the first fluid passage increases between the evaporation and condensation blocks, wherein a cross-section of the first fluid passage increases in a first section configured to connect to the evaporation block and the cross-section of the first fluid passage is constant in a second section, and wherein the first fluid passage has a plurality of first guides forming channels extending along the first and second sections to separate flow of the coolant in a vapor state.

9. The system of claim 1, wherein the micro cooling unit comprises:
   a first fluid passage coupled between evaporation and condensation blocks that has a plurality of first guides to separate flow of the coolant in a vapor state;
   a plurality of second guides configured to guide movement of a liquid state coolant from an output end of the liquid coolant moving block around the insulation block to a coolant reservoir; and
   a plurality of third guides configured to guide movement of the liquid state coolant from the condensation block around the insulation block to an input end of the liquid coolant moving block, wherein the third guides are fewer in number than the second guides.

10. The system as claimed in claim 1, wherein the heat source connecting unit is configured to thermally couple to a main board, and wherein when the frame is removed a processor mounted on the main board is exposed.

11. A cooling system for use in a portable computer comprising:
   a dissipating plate having a dissipating fan in its one side and having a settle-down groove in its inside;
   a micro cooling system having a first side within the settle-down groove and a second opposite side configured to face a processor, wherein the micro cooling system is configured to perform heat exchange by repeating a cooling cycle of condensation and evaporation using a capillary phenomenon to transfer heat arising from the processor, wherein internally the micro cooling system comprises,
      a liquid coolant storage block at one end,
      a evaporation block having first size channels coupled to the liquid coolant storage block,
      a gaseous coolant moving block coupled to the evaporation block, and
      a condensation block having second channels larger than the first channels coupled to the gaseous coolant moving block.

12. The system of claim 11, wherein the dissipating plate is fastened to a main board in an inside of the portable computer.

13. The system of claim 12, wherein the dissipating plate is configured to removably provide access to a processor mounted on the main board comprising a coil spring that gives elastic force to a screw joining between the dissipating plate and the main board.

14. The system of claim 13, wherein the micro cooling system is thermally coupled to the processor when the dissipating plate is fastened to the main board, and wherein the micro cooling system adjacent to the processor is an identical material.

15. The system of claim 14, wherein the dissipating plate surrounds the processor to perform radiation cooling of an enclosed space.

16. The system of claim 11, wherein a settle unit in the settle-down groove and the micro cooling system are joined each other by brazing, and wherein a plurality of guide protuberances combine with the settle unit to position the processor.

17. The system of claim 11, wherein the micro cooling unit has a plurality of guides in a liquid coolant moving block, wherein first and second guides couple the liquid coolant moving block to the liquid coolant storage block and the liquid coolant condensation block.

18. The system of claim 11, wherein at least a portion of the micro cooling system and the processor are integrally formed of the same material.

19. A cooling system for a portable computer comprising:
   a frame having a heat-source connecting unit connected to a fan housing unit that has horizontal dimensions larger than the heat-source connecting unit at a connection point therebetween, wherein the heat-source connecting unit comprises,
      at least two parallel projections extending from the fan housing unit connected by a third projection to form a recess, and
      a plurality of joining bosses in the parallel projections, wherein an exposed surface of the joining bosses and projections extend in a plane with a prescribed height, and wherein the fan housing unit comprises,
      a bottom surface having an input port,
      at least three sides extending substantially vertically from the bottom surface of the fan housing unit to the prescribed height, and
      an output port in one of said sides of the fan housing unit;
   a dissipating unit adjacent said one side enclosing the output port of the fan housing unit of the frame that is configured to perform heat exchange;
   a dissipating fan in the fan housing unit configured to form an air stream that would pass through the dissipating unit from inside the fan housing unit; and
   a plate-heat pipe covering one side of the frame to form a top surface of the fan housing unit that encloses a prescribed area determined by the bottom surface and the sides of the fan housing unit for contacting said air stream and to form a top surface of the heat source connecting unit that contacts the exposed surface of the joining bosses and projections, wherein the plate-heat pipe overlaps a portion of the dissipating unit, and wherein the plate-heat pipe is configured to contact a heat source to deliver heat to the dissipating unit by circulating a fluid through its inside.

20. The system of claim 19, wherein the heat source connecting unit is configured to transfer heat from the heat source through the frame to the dissipating unit.

21. The system of claim 19, wherein the dissipating fan assembly is installed in a space partitioned by the fan housing unit and the plate-heat pipe and forms said air stream that collides against the plate-heat pipe and then the dissipating unit.

22. The system of claim 19, wherein the frame is fastened to a main board in the portable computer, wherein the dissipating unit is thermally coupled to a processor in the main board, and wherein the frame and the plate-heat pipe are configured to provide access to the processor.

23. The system of claim 19, wherein the plate-heat pipe is approximately 1.5 mm thick.

24. The system as claimed in claim 19, wherein the plate-heat pipe is approximately 1 mm thick.

25. A cooling system for a portable computer comprising:
   a frame having a recess in a first side and having a fan housing unit in a second side;
   a micro cooling system having a first side configured with a heat releasing part contained within the frame by the recess and a second opposite side configured to include a heat absorption part, wherein the micro cooling system is configured to perform heat exchange by repeating a cooling cycle of condensation and evaporation using a capillary phenomenon to transfer heat arising from the processor;
   a dissipating unit on one side of the fan housing unit of the frame that is configured to perform heat exchange;
   a dissipating fan with the fan housing unit configured to form an air stream that would pass through the dissipating unit from inside the fan housing unit; and
   a plate-heat pipe on one side of the frame and configured to deliver heat from the frame to the dissipating unit by circulating a fluid through its inside.

26. The cooling system of claim 25, wherein the micro cooling system has first and second layers having different characteristics.

27. The system of claim 25, wherein internally the micro cooling system comprises:
   a liquid coolant storage block at one end;
   a evaporation block having first size channels coupled to the liquid coolant storage block;
   a gaseous coolant moving block coupled to the evaporation block; and
   a condensation block having second channels larger than the first channels coupled to the gaseous coolant moving block.

* * * * *